(12) United States Patent
David et al.

(10) Patent No.: US 8,848,320 B1
(45) Date of Patent: Sep. 30, 2014

(54) ANISOTROPIC MAGNETORESISTIVE (AMR) SENSORS AND TECHNIQUES FOR FABRICATING SAME

(71) Applicant: Allegro Microsystems, LLC, Worcester, MA (US)

(72) Inventors: Paul A. David, Bow, NH (US); William P. Taylor, Amherst, NH (US); Bryan Cadugan, Bedford, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

(21) Appl. No.: 14/043,057

(22) Filed: Oct. 1, 2013

(51) Int. Cl.
*G11B 5/33* (2006.01)

(52) U.S. Cl.
USPC ............................................. 360/327

(58) Field of Classification Search
CPC ............ G11B 5/33; G11B 5/127; G11B 5/187
USPC .............. 360/327, 327.32; 29/603.12, 603.13, 29/603.14, 603.16
See application file for complete search history.

(56) References Cited

U.S. PATENT DOCUMENTS

| | | | |
|---|---|---|---|
| 4,686,472 A | 8/1987 | Van Ooijen et al. | |
| 5,609,775 A | 3/1997 | Liu | |
| 6,850,057 B2 | 2/2005 | Witcraft et al. | |
| 6,897,532 B1 * | 5/2005 | Schwarz et al. | 257/367 |
| 6,993,826 B2 * | 2/2006 | Takahashi et al. | 29/603.12 |
| 7,046,117 B2 * | 5/2006 | Wan | 338/32 R |
| 7,177,117 B1 * | 2/2007 | Jiang et al. | 360/125.12 |
| 7,522,377 B1 * | 4/2009 | Jiang et al. | 360/125.12 |
| 8,680,857 B2 * | 3/2014 | Phan Le et al. | 324/252 |
| 2003/0132826 A1 * | 7/2003 | Wan | 338/32 R |
| 2011/0187361 A1 * | 8/2011 | Vanhelmont et al. | 324/252 |
| 2012/0182658 A1 * | 7/2012 | Motz | 361/91.5 |

OTHER PUBLICATIONS

Caruso, et al.; A New Perspective on Magnetic Field Sensing, http://www51.honeywell.com/aero/common/documents/myaerospacecatalog-documents/Defense_Brochures-documents/Magnetic_Literature_Technical_Article-documents/A_New_Perspective_on_Magnetic_Field_Sensing.pdf; May 1998; pp. 1-19.
Notice of Allowance for U.S. Appl. No. 14/042,982, filed Oct. 1, 2013
Office Action dated Jun. 18, 2014 for U.S. Appl. No. 14/042,982, filed Oct. 1, 2013.
Office Action dated Jun. 18, 2014 for U.S. Appl. No. 14/042,955, filed Oct. 1, 2013.
Response filed Jun. 24, 2014; to Office Action dated Jun. 18, 2014 for U.S. Appl. No. 14/042,982.
Response filed Jun. 24, 2014; to Office Action dated Jun. 18, 2014 for U.S. Appl. No. 14/042,955.

* cited by examiner

*Primary Examiner* — Allen T Cao
(74) *Attorney, Agent, or Firm* — Daly, Crowley, Mofford & Durkee, LLP

(57) ABSTRACT

Novel anisotropic magneto-resistive (AMR) sensor architectures and techniques for fabricating same are described. In some embodiments, AMR sensors having barber pole structures disposed below corresponding AMR sensing elements are provided. AMR sensors having segmented AMR sensing elements are also described. Fabrication techniques that can be used to fabricate such sensors are also described. Fabrication techniques are also described that can reduce the risk of contamination during AMR sensor fabrication.

17 Claims, 10 Drawing Sheets

ANISOTROPIC MAGNETORESISTIVE (AMR) SENSORS AND TECHNIQUES FOR FABRICATING SAME

FIELD

Subject matter disclosed herein relates generally to sensors and, more particularly, to sensors that include magnetoresistive (MR) elements.

BACKGROUND

Magnetoresistance is the ability of a material to change its electrical resistance when exposed to an external magnetic field. This ability may be taken advantage of to provide, among other things, sensors for detecting magnetic field intensity. Anisotropic magnetoresistance (AMR) is a form of magnetoresistance where the change in resistance of a material depends upon the angle between the direction of magnetization and the direction of current flow in the material. Typically, the resistance of an AMR material will be a maximum when the magnetization of the material is in the same direction as the current. To achieve linear operation in an AMR sensor, an angle may need to be maintained between the direction of magnetization with no external magnetic field applied (i.e., the easy angle) and the current in the AMR element. Most modern AMR sensors use "barber pole" structures to provide the desired current angle. Typically, an angle of around 45 degrees is used.

As with any electrical device, there is a need for new and improved AMR sensor architectures. There is also a need for new techniques for efficiently and/or inexpensively fabricating AMR sensors. Techniques are also needed for producing AMR sensors that are capable of high performance operation.

SUMMARY

In accordance with a still another aspect of the concepts, systems, circuits, and techniques described herein, an anisotropic magneto-resistive (AMR) sensor comprises: an inter layer dielectric (ILD) surface; a seed layer formed over the ILD surface; an AMR element formed on the seed layer, the AMR element being at least partially formed from an AMR material; and barber poles formed over the AMR element, the barber poles each including a lower portion formed of metal and an upper portion formed of a capping material that is different from the metal of the lower portion, the upper portion of the barber poles to protect other materials in the AMR sensor from exposure to the metal of the lower portion of the barber poles.

In one embodiment, the capping material of the upper portion of the barber poles includes tantalum.

In one embodiment, the capping material of the upper portion of the barber poles is a first capping material; and the AMR element includes a lower portion formed of an AMR material and an upper portion formed of a second capping material, the upper portion of the AMR element to protect other materials in the AMR sensor from exposure to the AMR material in the lower portion of the AMR element.

In one embodiment, the second capping material of the AMR element has a higher resistivity than the AMR material of the AMR element.

In one embodiment, the AMR material includes nickel-iron (NiFe) and the second capping material includes at least one of: tantalum, ruthenium, titanium, aluminum, and alloys containing at least of one these metals.

In one embodiment, the AMR sensor further comprises a passivation layer covering the barber poles and the AMR element.

In one embodiment, the passivation layer contacts the AMR material of the AMR element through regions between the barber poles.

In one embodiment, the capping material of the upper portion of the barber poles is a first capping material; the AMR element includes a lower portion formed of an AMR material and an upper portion formed of a second capping material; and the passivation layer contacts the second capping material of the upper portion of the AMR element through regions between the barber poles.

In accordance with a yet another aspect of the concepts, systems, circuits, and techniques described herein, a method for fabricating an anisotropic magneto-resistive (AMR) sensor, comprises: providing an inter layer dielectric (ILD) surface; depositing a seed layer over the ILD surface; forming a layer of AMR material on the seed layer; forming a metal layer over the layer of AMR material; forming a capping layer over the metal layer; performing first patterning after forming the capping layer, the first patterning to form an AMR element from the layer of AMR material; and performing second patterning after performing the first patterning, the second patterning to form barber poles from the metal layer and the capping layer.

In one embodiment, the capping layer is to reduce exposure of other materials in the AMR sensor to the metal of the metal layer.

In one embodiment, performing first patterning includes stopping the first patterning within a dielectric material.

In one embodiment, performing second patterning includes stopping the second patterning at the AMR material of the AMR element.

In one embodiment, the capping layer is a first capping layer; and the method further comprises forming a second capping layer over the layer of AMR material before forming the metal layer.

In one embodiment, performing second patterning includes stopping the second patterning at or within the second capping layer.

In one embodiment, the first capping layer and the second capping layer each include tantalum.

In one embodiment, performing first patterning and performing second patterning both include using ion beam etching.

In one embodiment, performing first patterning and performing second patterning use different etching techniques.

BRIEF DESCRIPTION OF THE DRAWINGS

The foregoing features may be more fully understood from the following description of the drawings in which.

DETAILED DESCRIPTION

Figure 1:
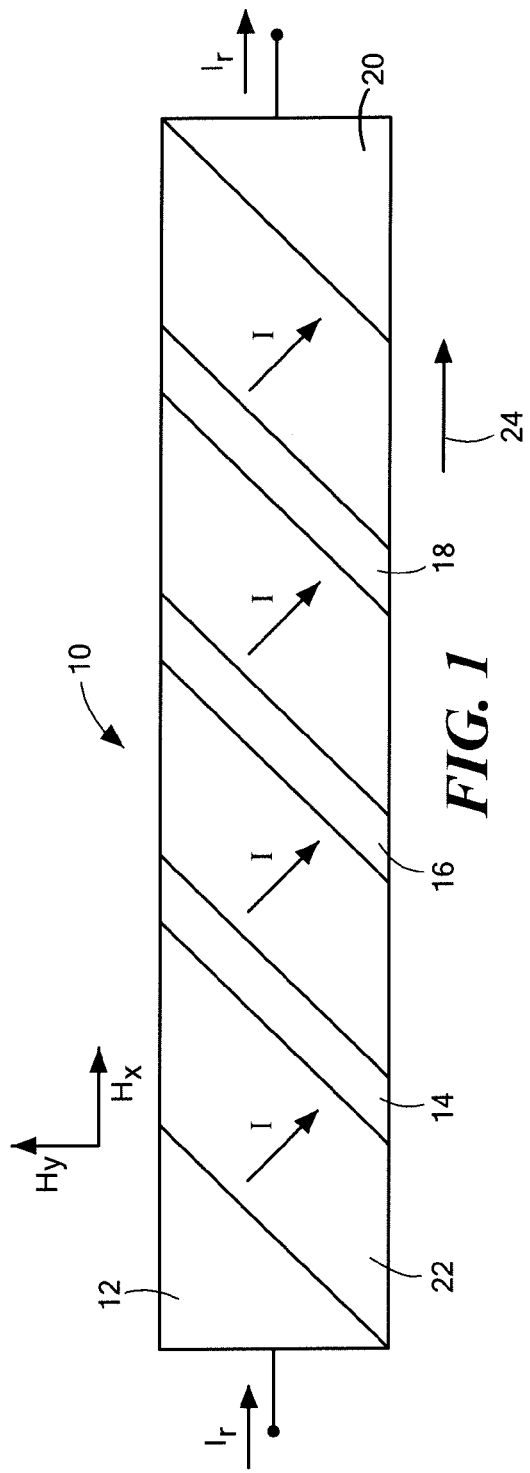
FIG. 1 is a top view of a conventional anisotropic magnetoresistive (AMR) sensor having metallic barber poles disposed on top of an underlying film of AMR material.

FIG. 1 is a top view of an anisotropic magnetoresistive (AMR) sensor 10 having metallic barber poles 12, 14, 16, 18, 20 disposed on top of an underlying film 22 of a magnetic material having the AMR property (which will be referred to hereinafter as an AMR material). The barber poles 12, 14, 16, 18, 20 are formed of aluminum or other suitable conductor and are oriented at an angle of 45 degrees with respect to a longitudinal direction 24 of the sensor. During sensor operation, a test current $I_r$ is applied to the sensor 10 to measure changes in an electrical resistance of the film 22 of AMR material to sense an external magnetic field. Typically, a number of AMR sensor elements may be implemented in a bridge configuration to facilitate the measurement of the resistance changes. In other embodiments, the segments of the barber poles 12 and 20 are not included and contact is made to the AMR layer in those areas.

The current $I_r$ may be applied to a first barber pole 12 of the sensor 10. Because of the resistivity of the barber poles 12, 14, 16, 18, 20 is much lower than that of the AMR material, the current will flow through the barber poles 12, 14, 16, 18, 20 when it can, and will flow through the underlying AMR material 22 in the gaps between the barber poles 12, 14, 16, 18, 20. In addition, the differences in resistivity between the materials will cause the current in the gap regions to flow through the AMR material at an angle dictated by the angle of the barber poles 12, 14, 16, 18, 20. This is because the current will take the shortest route through the higher resistivity material (i.e., perpendicular to the edges of the barber poles 12, 14, 16, 18, 20). It is due to the magnetic field being measured that the route is changed and thus the resistance is increased. As shown in FIG. 1, the current I through the AMR material flows at a 45 degree angle to the longitudinal direction 24 of the sensor. The current eventually exits the sensor 10 at the last barber pole 20. In general, the barber poles need to be made of a material with low enough resistance (or resistivity) to effectively redistribute the current flow.

In a typical implementation, the underlying film 22 of AMR material may be formed so that a magnetization vector with no applied magnetic field (i.e., the easy axis) is in a longitudinal direction with respect to the sensor 10 (i.e., along a long axis of the sensor 10 or the AMR element). The sensor may then be used, for example, to sense changing magnetic fields in a transverse direction. Other arrangements may alternatively be used.

In conventional AMR sensors, the barber poles are implemented on top of the AMR element, as described above. It was found that this approach presented a potential for contamination in some fabrication process flows. For example, in some conventional process flows, etches performed during fabrication are required to stop on the AMR material (e.g., permalloy (NiFe), etc.) of the AMR element, which exposes the etching tool to NiFe contamination. In conceiving some of the features, techniques, and structures described herein, it was determined that fabrication efficiencies and cost reductions could be achieved by forming the AMR element above (or after) the barber poles during sensor fabrication. As indicated above, the AMR elements of AMR sensors are often formed from a material known as permalloy, which is an alloy of nickel and iron. In general, iron is a material that is not easy to deal with in a clean room fabrication environment. By forming the AMR element above the barber pole structures, the lower portion of the AMR sensor can be generated using a standard device fabrication process (e.g., a CMOS, BiCMOS, or similar standardized process). The AMR element can then be added using a different process (e.g., in a different fabrication environment, equipment, or clean room) without having to expose the original fabrication environment to NiFe or another AMR material.

Figure 2:
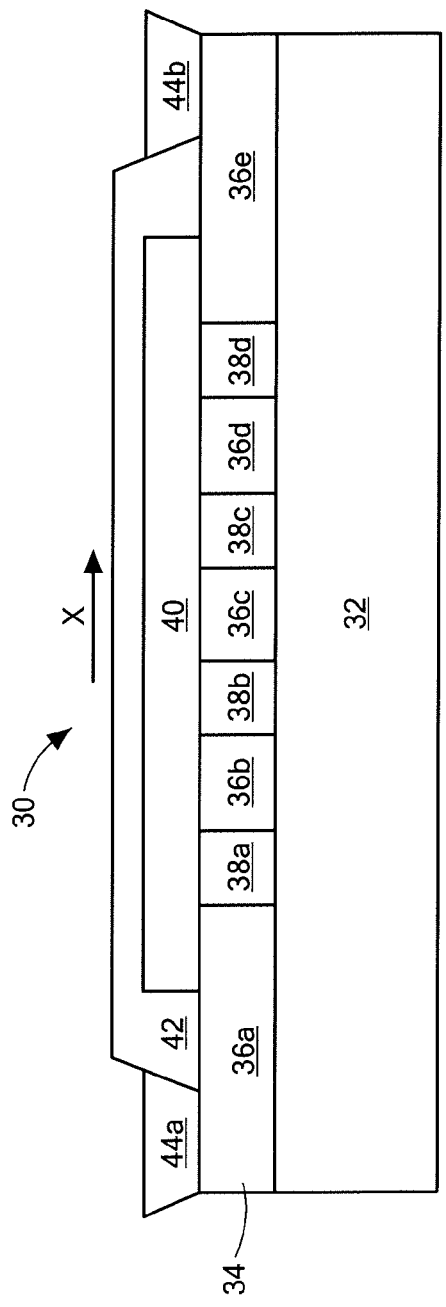
FIGS. 2 and 3 are sectional side views of exemplary AMR sensor architectures having AMR elements disposed above barber pole elements in accordance with various embodiments.

FIG. 2 is a sectional side view of an exemplary AMR sensor 30 in accordance with an embodiment. It should be appreciated that the structures illustrated in FIG. 2, and in other figures described herein, may not be to scale. That is, one or more dimensions within the various figures may be exaggerated to increase clarity and facilitate understanding. As shown, the AMR sensor 30 may be formed on top of an inter layer dielectric (ILD) 32 or substrate. As used herein, the terms "ILD," "ILD layer," and "ILD surface" encompass any surface of dielectric material within a device including a substrate of dielectric material or layers higher than the substrate. The ILD layer may be formed of any of a variety of different dielectric materials including, for example, $SiO_2$, $Si_xN_y$ (nitride), $Al_2O_3$ (or other aluminum oxide compounds), and many others. A metal layer 34 may be deposited on the ILD surface and formed into metal elements to serve as barber poles 36a, 36b, 36c, 36d, 36e. Any of a variety of different techniques may be used to shape the barber poles 36a, 36b, 36c, 36d, 36e including, for example, deposition, photolithography, and etch; or seed layer deposition, patterning (photolithography), and electroplating, and/or others. Although illustrated in FIG. 2 with 5 barber pole elements 36a, 36b, 36c, 36d, 36e, it should be appreciated that any number of elements greater than 2 may be used in different implementations. The metal layer 34 may be formed of aluminum, copper, gold, or any other metal or metal alloy having the desired characteristics to serve as barber pole elements.

Although not shown in FIG. 2, the barber poles 36a, 36b, 36c, 36d, 36e may be oriented at a fixed angle (e.g., 45 degrees, etc.) with respect to a longitudinal direction (x) of the sensor 30 (as viewed from above). Alternatively, the barber poles 36a, 36b, 36c, 36d, 36e may be oriented at a variable angle, where the edge of the barber pole changes angle across the AMR width. In some embodiments, the regions 38a, 38b, 38c, 38d between the barber poles 36a, 36b, 36c, 36d, 36e may be filled with a dielectric material after the barber poles are formed. An upper surface of metal layer 34 with the dielectric material in the regions may then be planarized using any of a variety of planarization techniques.

After the barber poles 36a, 36b, 36c, 36d, 36e have been formed, an AMR element 40 may next be formed above metal layer 34. The AMR element 40 may be formed of any of variety of AMR materials, the most common of which is NiFe. As described previously, in some implementations, the formation of the AMR element 40 (as well as subsequent processing steps) may be performed in a different processing environment or clean room from the above described fabrication steps. In one approach, a film of AMR material may first be deposited as a sheet or layer over an upper surface of metal layer 34. A mask may then be applied to the AMR film and the film may be etched into the desired shape of AMR element 40. In some cases, the mask may be a photoresist mask, while in other cases a hard mask such as an oxide or a nitride may be deposited and then patterned with a photoresist or similar material. After the AMR element 40 has been formed, a layer of passivation 42 may be applied over the top and sides of the AMR element 40 to, among other things, protect the AMR element 40 from an external environment. Metallic contacts 44a, 44b may be formed to provide external connection points on the AMR sensor 30 to, for example, allow measurement circuitry to be coupled thereto. In other embodiments, these contacts connect to other areas of the integrated circuit. As shown, the metallic contacts 44a, 44b may each be conductively coupled to corresponding ones of the barber pole elements 36a, 36e. In other embodiments, alternative structures may be provided to permit connection to the sensor (e.g., tungsten plugs to provide connection from below, etc.). In still other embodiments, the pads for bonding may be provided elsewhere in the integrated circuit.

In the AMR sensor 30 of FIG. 2, some or all of the barber pole elements 36a, 36b, 36c, 36d, 36e may be arranged in an orientation that will result in a desired current flow direction within the AMR element 40 during sensor operation. In some embodiments, this current flow direction may within a range of approximately 30 to 60 degrees with respect to the long axis (or the longitudinal axis) of the AMR element 40. In at least one embodiment, this current flow direction is nominally 45 degrees with respect to the long axis of the AMR element 40.

Figure 3:
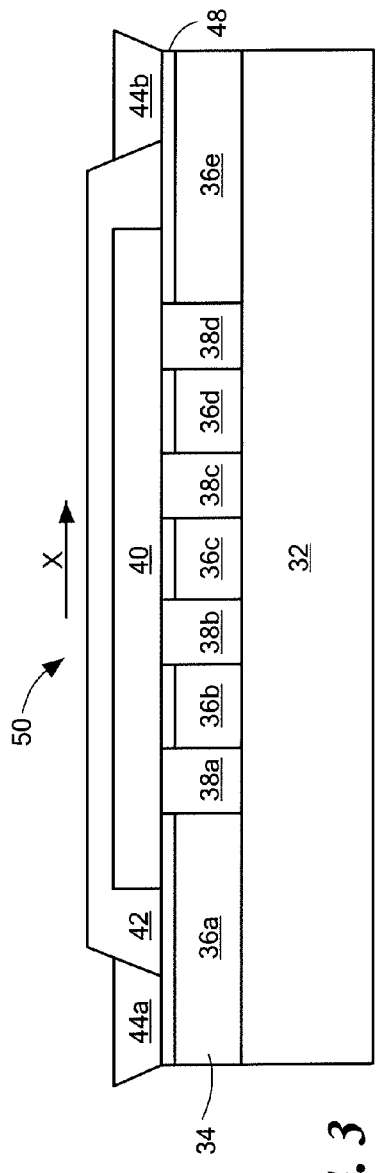

FIG. 3 is a sectional side view of an exemplary AMR sensor 50 in accordance with an embodiment. AMR sensor 50 is similar to AMR sensor 30 of FIG. 2, except one or more additional layers 48 exist between metal layer 34 and AMR element 40. For example, in one implementation, layer 48 may include a layer of hard metal (e.g., tungsten (W), titanium (Ti), titanium nitride (TiN), etc.) on top of metal layer 34 to facilitate subsequent planarization (e.g., polishing, etc.). If used, the hard metal layer may be applied before the barber pole elements are patterned on metal layer 34. The material used for the hard metal layer must have an appropriate conductivity for use between the barber pole elements of metal layer 34 and AMR element 40.

In addition to, or as an alternative to, the hard metal layer, layer 48 may also include a seed layer to facilitate uniform growth of the AMR film above metal layer 34. The seed layer may be formed from any of variety of different materials including, for example, copper (Cu), gold (Au), and/or others. If used, the seed layer would preferably be applied after planarization. In some embodiments, an adhesion layer may precede the seed layer to improve the mechanical adhesion of the seed layer to the underlying layer. The adhesion layer may include, but is not limited to, a titanium or chromium layer having a thickness in the range of approximately 10 to 500 Angstroms.

Layer 48 may also, or alternatively, include a diffusion barrier to prevent diffusion of material between metal layer 34 and AMR element 40 (e.g., diffusion between an aluminum layer and a NiFe layer, etc.). In some embodiments, a single metal layer may be used that serves as both a diffusion barrier and a hard metal layer. The material that is used in these layers will typically depend on the materials used in metal layer 34 and AMR element 40. When aluminum is used in the metal layer 34 and NiFe is used in AMR element 40, materials such as tungsten (W), titanium (Ti), titanium nitride (TiN), etc. may be used as both a diffusion barrier and a hard metal layer.

In some embodiments, non-metallic materials may be used as a hard/diffusion barrier. For example, in at least one embodiment, a very thin layer of alumina ($Al_2O_3$) or a similar dielectric material may be used. The alumina layer must be thin enough to allow electron tunneling between the barber poles and the AMR element (e.g., less than 3 to 8 Angstroms in thickness, and maybe less than 1 Angstrom). Such layers may provide an increased level of hardness to facilitate planarization.

Figure 4:
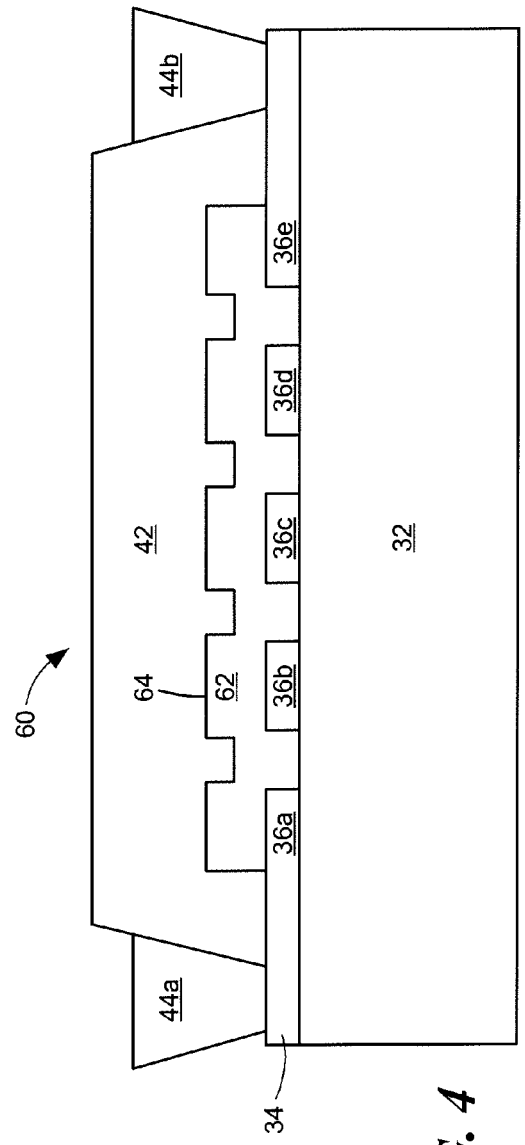
FIG. 4 is a sectional side view of an exemplary AMR sensor architecture having an AMR element disposed above barber pole elements that does not use planarization in accordance with an embodiment.

FIG. 4 is a sectional side view of an exemplary AMR sensor 60 in accordance with still another embodiment. The AMR sensor 60 of FIG. 3 may be easier to construct than the previously described embodiments as one or more processing steps associated with those embodiments have been eliminated. As before, barber poles 36a, 36b, 36c, 36d, 36e are formed on a metal layer 34 above an ILD layer 32. However, instead of filling in the regions between the barber pole elements 36a, 36b, 36c, 36d, 36e with dielectric material and then planarizing, the AMR material may be deposited over the barber pole elements 36a, 36b, 36c, 36d, 36e and allowed to fill the regions. The resulting AMR film may then be patterned to a desired size and shape. This technique may require the AMR film layer to be thicker than the metal layer 34 associated with the barber poles. As shown, because the AMR film was allowed to fill in the regions, an upper surface 64 of the AMR element 62 may not be smooth (e.g., it may have depressions or other distortions corresponding to the regions below). In some embodiments, the upper surface 64 of the AMR element 62 may be planarized at this point. However, in other embodiments, as shown in FIG. 4, the upper surface 64 of the AMR element 62 may be left unplanarized and a passivation layer 42 may be applied to the unplanarized element. Contact pads 44a, 44b may then be added to the sensor 60 as described previously.

In some embodiments, one or more capping layers may be used within an AMR sensor to protect some materials within the sensor from other materials. One or more capping layers may also serve as an etch stop during sensor fabrication to avoid the need to etch down to one or more materials that may be problematic during sensor fabrication. As will be described in greater detail, in at least one embodiment, an AMR sensor having one or more capping layers may be fabricated using a simplified process whereby all layers of the sensor element and the barber poles are deposited before any patterning is performed. Patterning may then be performed in two successive stages: a first stage to form the shape of the AMR element and a second stage to form the shape of the barber pole elements.

Figure 5:
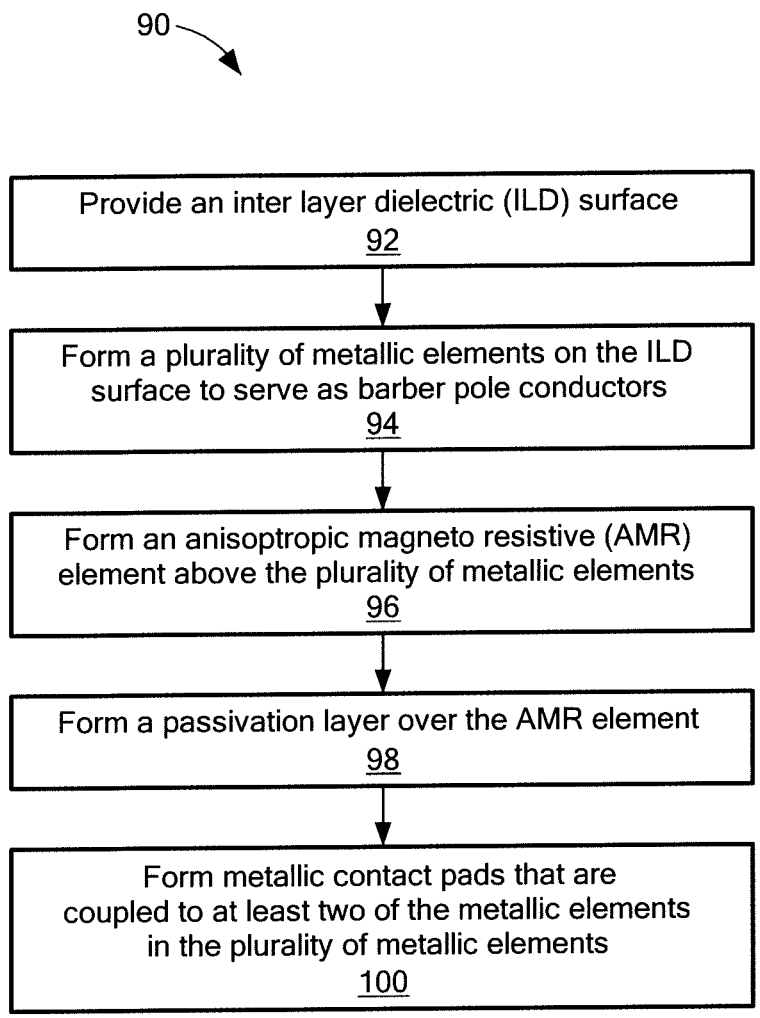
FIG. 5 is a flowchart illustrating an exemplary method for fabricating an AMR sensor having an AMR element disposed above barber pole elements in accordance with an embodiment.

FIG. 5 is a flowchart illustrating an exemplary method 90 for fabricating an AMR sensor in accordance with an embodiment. The method 90 may be used to fabricate sensors such as, for example, those illustrated in FIGS. 2, 3, and 4, as well as other AMR sensors. An inter layer dielectric (ILD) surface is first provided upon which the AMR sensor will be built (block 92). A plurality of metallic elements may next be formed above the ILD surface to serve as barber pole conductors for the AMR sensor (block 94). In some embodiments, the formation of the metallic elements may include the deposition of one or more of a hard metal layer, a diffusion barrier, or a seed layer above the metallic elements. One or more layers of metal may be deposited on the ILD surface and the layers may then be masked and etched to form the metallic elements. As described previously, the metallic elements may be oriented at an angle (e.g., 45 degrees) to a longitudinal direction associated with the sensor being fabricated.

An AMR element may next be formed above the plurality of metallic elements (block 96). In some embodiments, the regions between the metallic elements may be filled with a dielectric material and a planarization process may then be used to planarize an upper surface of the metallic elements before the AMR element is formed. In other embodiments, the AMR element may be formed without first filling in the regions and planarizing. In these embodiments, the AMR element may extend down to the ILD surface below. To form the AMR element, a film of AMR material may first be deposited over the metallic elements. Patterning may then be used to shape the AMR film into the desired element shape.

After the AMR element has been formed, a passivation process may be used to enclose the AMR element, and possibly the metallic elements, to protect them from an external environment (block 98). In embodiments where the regions between the metallic elements were not filled in with dielectric material, the upper layer of the AMR element may be uneven. In some embodiments, the passivation may be applied directly to the uneven AMR element without first planarizing the upper surface thereof. In other embodiments, the upper surface of the AMR element may be planarized before the passivation is applied.

In some embodiments, metallic contact pads may next be formed to provide external connection points for the AMR sensor (block 100). These contact pads may be used, for example, to connect external measurement circuitry to the AMR sensor. The metallic contact pads may be formed through the passivation material to contact corresponding ones of the metallic elements. In other embodiments, other techniques may be used to provide external connection to the AMR element.

Figure 6:
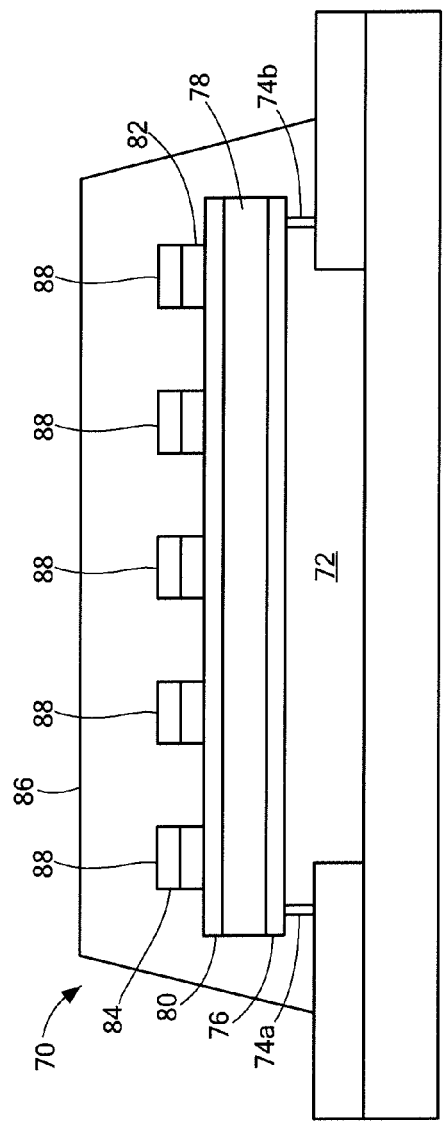
FIG. 6 is a sectional side view of an exemplary AMR sensor that includes multiple capping layers in accordance with an embodiment.

FIG. 6 is a sectional side view of an exemplary AMR sensor 70 that includes multiple capping layers in accordance with an embodiment. As shown, the AMR sensor 70 may be formed above, for example, an ILD layer 72. In some embodiments, tungsten plugs 74a, 74b may be provided in the ILD layer 72 to allow connection to the sensor 70 from below. The AMR sensor 70 may have an AMR element 78 formed above the ILD layer 72. The AMR element 78 may have a seed layer 76 below it. The seed layer 76 may be provided to, for example, facilitate growth of an AMR film from which the AMR element 78 is formed. In some implementations, a seed layer may not be present.

A first capping layer 80 may be formed over the AMR element 78. One purpose for the first capping layer 80 may be to protect other materials within the AMR sensor 70 from the AMR material of the AMR element 78. Another possible purpose may be to serve as an etch stop during formation of the barber poles of the sensor 70 so that the etch does not extend through to the AMR material (which can cause contamination). The first capping layer 80 may be formed of any material that is capable of protecting other materials in the AMR sensor 70, at least to some extent, from the AMR material of AMR element 78. Capping materials that may be used include, for example, tantalum (Ta), tungsten (W), titanium (Ti), titanium nitride (TiN), and others. If used, the capping layer 80 should be thin so that it does not increase the resistance to the barber pole structures and thereby prevent a significant portion of the total current in the AMR layer 78 from flowing into the barber poles. Alternatively, a more conductive capping layer 80 can be used such as ruthenium (Ru), where the conductivity is high enough as not to pose the same restriction of thinness as noted above. As shown in FIG. 6, even with capping layer 80, there may be some exposure to the AMR material of element 78 on the sides of the element. However, this exposure will typically only be a small percentage of the exposure that would exist without the capping layer 80.

With reference to FIG. 6, barber poles 88 may be formed over the AMR element 78. The barber poles 88 may each have a lower portion 82 formed of a metal material such as, for example, copper, copper-aluminum, aluminum, or some other metal. The barber poles 88 may each also have an upper portion to serve as a second capping layer 84 to protect other materials in the sensor 70 from the metal of lower portion 82. The second capping layer 84 may be formed of the same material as, or a different material from, the first capping layer 80 (e.g., tantalum (Ta), tungsten (W), titanium (Ti), titanium nitride (TiN), and/or others).

In at least one embodiment, to form the AMR sensor 70 of FIG. 6, the seed layer 76, a layer of AMR material, the first capping layer 80, a metal layer, and the second capping layer 84 may all be deposited before any patterning is done. The patterning may then be performed in two steps. In at least one embodiment, ion beam etching may be used to perform the patterning in both steps, although other techniques or combinations of techniques may alternatively be used. The first patterning step is performed to form the desired shape of the AMR element 78. The second patterning step is performed to form the desired shape of the barber poles 88. During sensor fabrication, the first patterning step may stop on the ILD layer 72 or some other dielectric layer. The second patterning step may stop at or within the first capping layer 80. In this manner, the AMR material is not exposed from above, thereby reducing the risk of contamination. Masks may be formed for each patterning step and then stripped after each patterning is complete. In some cases, masks may remain if they do not interfere with a subsequent step in the process and then mask materials may be etched at the same time if appropriate before moving on to a subsequent process step.

Figure 7:
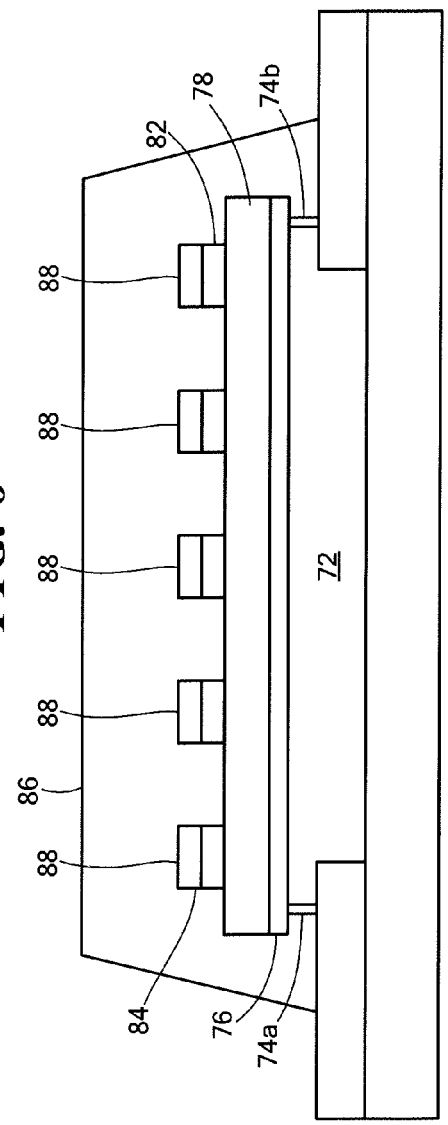
FIG. 7 is a sectional side view of an exemplary AMR sensor that includes a single capping layer in accordance with an embodiment.

After the barber poles 88 have been formed, a passivation material 86 may be applied over the AMR sensor 70 to protect the sensor from external environmental conditions. In some embodiments, as shown in FIG. 7, an AMR sensor similar to that of FIG. 6 may be fabricated without the first capping layer 80. In such embodiments, the etch process to form the barber poles will extend down to the AMR material of the AMR sensor 78.

Figure 8:
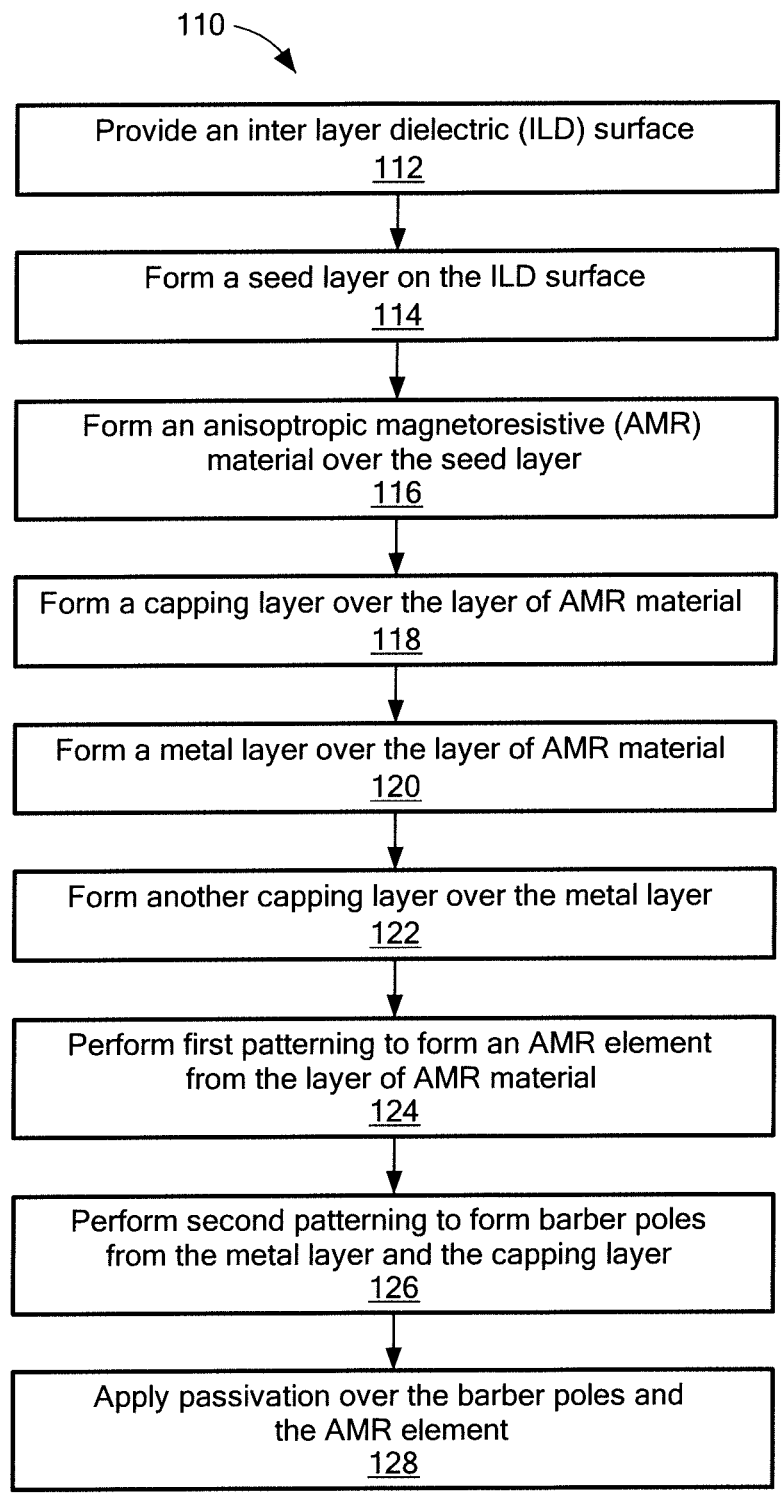
FIG. 8 is a flowchart illustrating an exemplary method for use in fabricating an AMR sensor having at least one capping layer in accordance with an embodiment.

FIG. 8 is a flowchart illustrating an exemplary method 110 for use in fabricating an AMR sensor in accordance with an embodiment. The method 110 may be used to fabricate, for example, the sensor 70 of FIG. 6 or similar sensors. As illustrated, an ILD surface may first be provided (block 112). An optional adhesion and/or seed layer may then be formed on the ILD surface to facilitate the deposition of an AMR film (block 114). An AMR film may then be formed on the seed layer (or the ILD surface if a seed layer is not provided) (block 116). A first capping layer may next be deposited over the AMR film (block 118). In some embodiments, a first capping layer is not provided.

A metal layer (e.g., a layer of copper or another metal or metal alloy) may next be formed above the layer of AMR material (block 120). A second capping layer may then be formed above the metal layer (block 122). A first patterning step may then be performed to form the desired shape of the AMR element (block 124). A second patterning step may then be performed to form the barber poles over the AMR element (block 126). The first and second patterning steps may use the same patterning process or different processes. In at least one implementation, photolithography and then ion beam etching is used for both steps. An optional hard mask may be deposited before photolithography and then patterned after photolithography before the ion beam etch step. If a first capping layer is used, the second patterning step to form the barber poles may be stopped within the first capping layer before it reaches the AMR element. If a first capping layer is not used, the second patterning step may extend down to the AMR element. After the barber poles have been formed, a passivation process may be used to cover the barber poles and the AMR material with a passivation material (block 128). Metallic contacts may then be formed through the passivation material to provide an electrical connection to the AMR sensor or some other connection technique may be used (e.g., a connection from below using tungsten plugs, etc.).

Figure 9A:
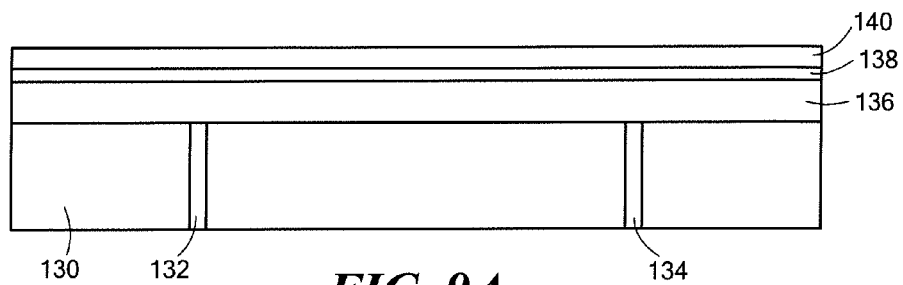
FIGS. 9A-9E are sectional side views illustrating various stages in an exemplary process for fabricating an AMR sensor in accordance with an embodiment.

FIGS. 9A-9E are sectional side views illustrating various stages in an exemplary process for fabricating an AMR sensor in accordance with an embodiment. With reference to FIG. 9A, the process may begin with an ILD layer 130 with or without tungsten plugs 132, 134. A layer of AMR material 136 (e.g., NiFe, etc.) may then be deposited upon the ILD layer 130 using any known deposition process. In some embodiments, a seed layer may first be formed on the ILD layer 130 before the AMR layer 136 is deposited (although this is not performed in every embodiment). A first metal layer 138 and a second metal layer 140 may then be deposited over the layer of AMR material 136. As will be described in greater detail, the materials used for the first and second metal layers 138, 140 may be selected based upon the etching processes and chemistries that work well with the two materials. In some embodiments, the first metal layer 138 may be formed from titanium tungsten (TiW), or some other titanium based compound, and the second metal layer 140 may be formed from aluminum copper (AlCu), or some other aluminum based compound (e.g., Al, AlSi, etc.). Other materials may be used for the first and second metal layers 138, 140 in other embodiments. In some embodiments, an adhesion layer and/or diffusion barrier may be deposited between the layer of AMR material 136 and the first metal layer 138 to improve adhesion and/or reduce diffusion (although these layers are not used in every embodiment).

Figure 9B:
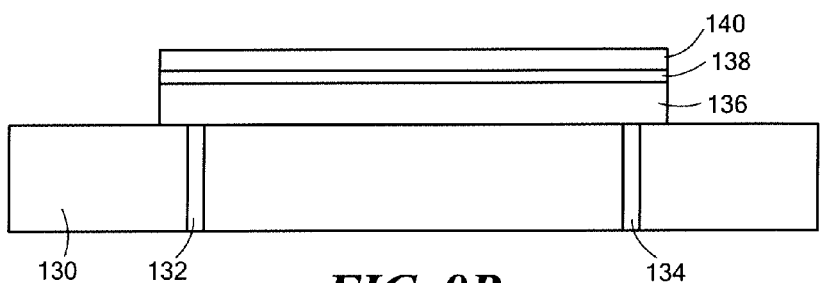
Figure 9C:
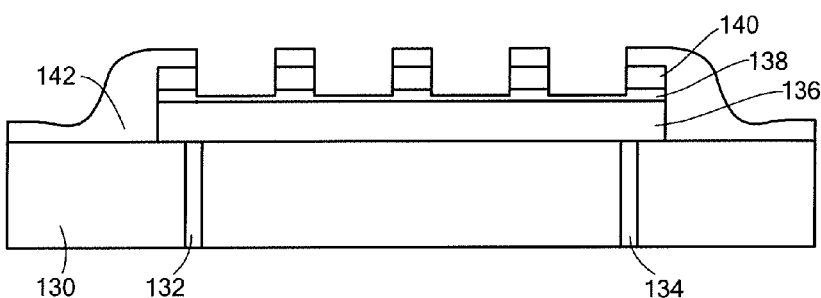

Referring now to FIG. 9B, the AMR layer 136 and the first and second metal layers 138, 140 may next be patterned into an AMR element 136 having first and second metal layers 138, 140 above. Any of a variety of different patterning techniques may be used to form the AMR element 136. With reference to FIG. 9C, a layer of photo-resist 142 or other mask material may be formed over the AMR element 136 and the first and second metal layers 138, 140. The photo-resist layer 142 may then be formed into a mask having the pattern of the barber poles of the AMR sensor being fabricated. A first etching process and process chemistry may then be used to etch through the second metal layer 140 to a point at a top boundary of or within (but not all the way through) the first metal layer 138, as shown in FIG. 9C. A second etching process and process chemistry may then be used to etch the rest of the way through the first metal layer 138 (and any intervening layers) to the AMR element 136.

In at least one embodiment, the second etching process will be a process that does not significantly attack the AMR material of the AMR element 136 such that the AMR film will not function as the desired magnetic field sensor. As such, the material used for the first metal layer 138 may be a material that works well with the selected etching process. As described above, in some embodiments, titanium tungsten (TiW) or some other titanium based compound may be used for the first metal layer 138. In these embodiments, a dry etch process using a flourinated chemistry such as, for example, $CF_4$, $CHF_3$, $SF_6$, or others may be used for the second etching process as these chemistries do not attack magnetic films, such as NiFe. As an alternative, in some embodiments, a wet etch process may be used for the second etching process using a chemistry such as, for example, hydrogen peroxide/water ($H_2O_2/H_2O$) or phosphoric acetic nitric (PAN). Other processes are also possible for the second etching process. The first etching process used to etch through the second metal layer 140 can be a process that does attack the AMR material as this process will not reach the AMR element 136 during fabrication. This process may include, for example, a dry etch process using a chlorinated chemistry such as, for example, $BCl_3$ or $Cl_2$. These chemistries work well with aluminum and aluminum compounds as well as other metals. Other processes may alternatively be used for the first etching process.

Figure 9D:
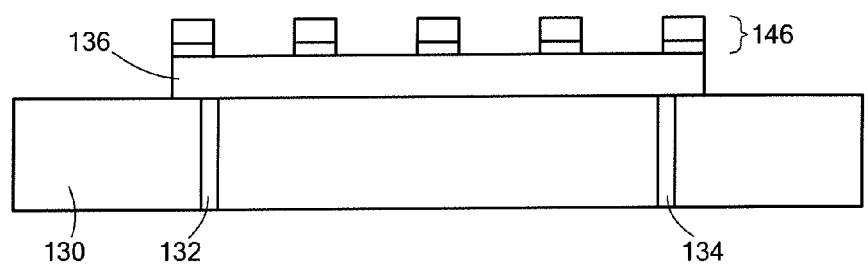
Figure 9E:
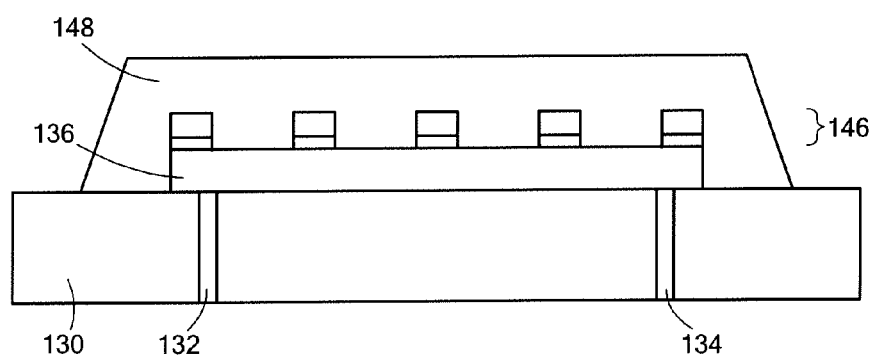

After the second etching process has completed, the photo-resist 142 may be stripped to compete the formation of the barber poles. FIG. 9D shows the resulting sensor with barber poles 146 after the photo-resist 142 has been stripped. In some cases, it may be desirable to deposit a hard mask and pattern the hard mask (e.g., if a wet etching process is used for the second etching process), and it may be desirable to strip the photo-resist 142 before the second etching process. As shown in FIG. 9E, after the barber poles 146 have been formed, a coating of passivation 148 may be applied to the sensor to protect it from, for example, an exterior environment. Any of various techniques may be used to provide an external electrical connection to the sensor.

Figure 10:
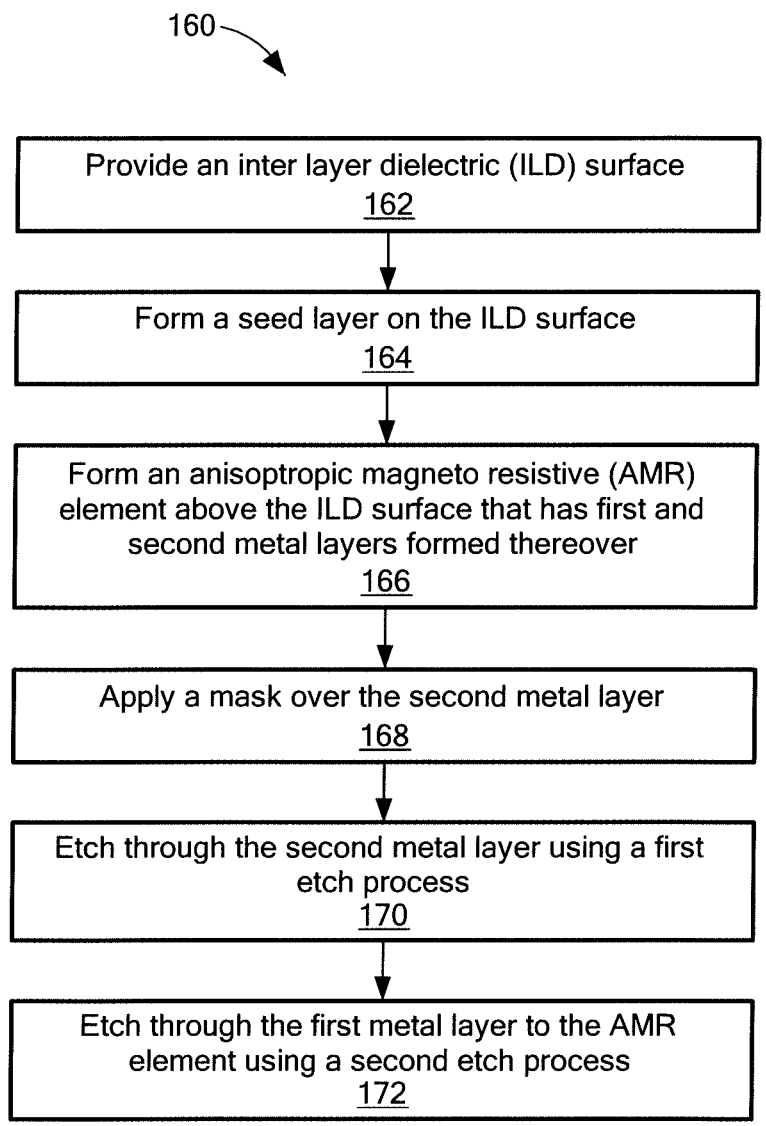
FIG. 10 is a flowchart illustrating a method for fabricating an AMR sensor using two different etching processes in accordance with an embodiment.

FIG. 10 is a flowchart illustrating a method 160 for fabricating an AMR sensor in accordance with an embodiment. The method 160 may be used to fabricate, for example, the sensor shown in FIG. 9E as well as other AMR sensors. An ILD surface may first be provided upon which the sensor will be formed (block 162). A seed layer may then be formed on the ILD surface (block 164). In some embodiments, a seed layer may not be used. An AMR element having first and second metal layers above it may then be formed over the ILD surface (block 166). The first and second metal layers will be used to form the barber poles of the AMR sensor. In at least one embodiment, the first metal layer is formed of titanium-tungsten (TiW) or another titanium compound and the second metal layer is formed of aluminum-copper (AlCu) or another aluminum compound. Other metal materials may alternatively be used. In one approach, the AMR element with the first and second metal layers may be formed by first depositing a layer of AMR material over the ILD surface and then depositing first and second metal layers over the layer of AMR material. The three layers may then be patterned together into the desired shape of the AMR element. Other techniques may alternatively be used to form the AMR element.

A mask may next be applied over the second metal layer to form the barber poles of the sensor (block 168). A first etching process is then used to etch through the second metal layer (block 170). The first etching process may be stopped once the first metal layer is reached, or somewhere within the first metal layer, but will not be permitted to proceed all the way through to the AMR material of the AMR element. A second etching process may then be used to finish the etch through to the AMR material of the AMR element (block 172). The second etching process will be a process that is less deleterious to the AMR material than the first etching process would be. In at least one embodiment, the first etching process is a dry etch using a chlorinated chemistry and the second etching process is a dry process using a flourinated chemistry. In another approach, the first etching process is a dry etch using a chlorinated chemistry and the second process is a wet etching process using, for example, a hydrogen peroxide-water chemistry. Other process combinations may alternatively be used.

In conventional AMR sensors, barber pole structures are typically formed in abutting conductive relation to an underlying AMR element. In some embodiments described below, separation exists between barber pole conductors and AMR material. In these embodiments, via connections or other structures for providing interlayer conductive coupling may be used to couple the barber poles to the AMR material. In addition, in some embodiments, instead of using a single continuous AMR element as in conventional sensors, a segmented element is used that has multiple separate AMR element sections that are interconnected with one another through the barber pole conductors.

Figure 11:
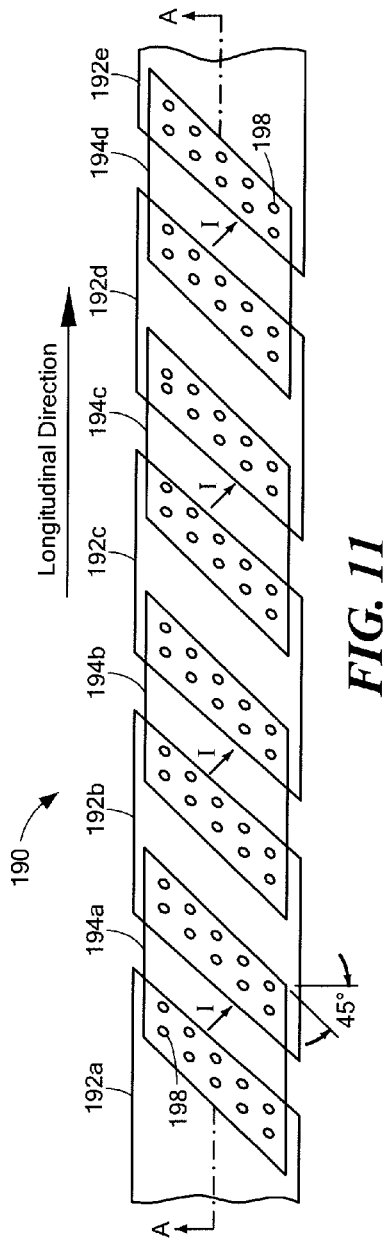
FIGS. 11 and 12 are a top view and a sectional side view, respectively, of an AMR sensor that uses a segmented AMR element in accordance with an embodiment.
Figure 12:
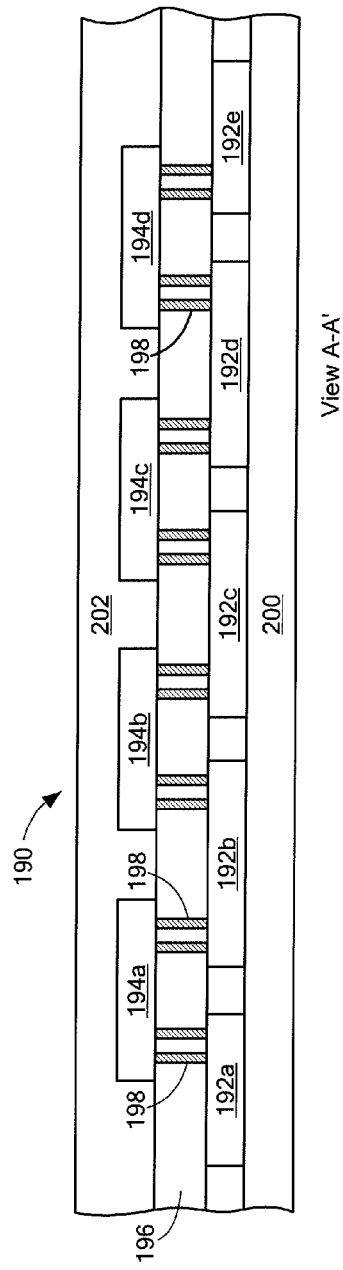

FIGS. 11 and 12 are a top view and a sectional side view, respectively, of an AMR sensor 190 that uses a segmented AMR element in accordance with an embodiment. As shown in FIGS. 11 and 12, the AMR sensor 190 includes a number of barber pole conductor elements 192a, 192b, 192c, 192d, 192e on a first layer and a number of AMR element segments 194a, 194b, 194c, 194d on a second layer that is above the first layer. The barber pole conductor elements 192a, 192b, 192c, 192d, 192e may be formed on an ILD layer 200. In the illustrated embodiment, the first and second layers are separated from one another by one or more intervening dielectric layers 196. Via connections 198 are used to provide conductive coupling between the barber pole conductor elements 192a, 192b, 192c, 192d, 192e and the AMR element segments 194a, 194b, 194c, 194d. Techniques for forming via connections between conductive layers are known in the art. Although illustrated with four AMR element segments 194a, 194b, 194c, 194d in FIGS. 11 and 12, it should be appreciated that any number of AMR element segments (i.e., two or more) may be used in other segmented AMR element embodiments. In addition, in at least one implementation, the finished sensor 190 may include a passivation layer 202 covering the AMR element segments 194a, 194b, 194c, 194d and dielectric layer 196.

As shown in FIG. 12, the barber pole conductor elements 192a, 192b, 192c, 192d, 192e and the AMR element segments 194a, 194b, 194c, 194d may be interconnected so that a current applied to a barber pole element at one end of the sensor (e.g., element 192a) will flow through all of the barber pole conductor elements 192a, 192b, 192c, 192d, 192e and all of the AMR element segments 194a, 194b, 194c, 194d in an alternating fashion (i.e., barber pole element, AMR element segment, barber pole element, AMR element segment, and so on) before emerging from a barber pole element at an opposite end of the sensor (e.g., element 192e). In addition, the locations and orientation of the via connections 198 and the conductivities of the associated materials, may be selected so that the current I will flow through the AMR element segments 194a, 194b, 194c, 194d at an angle to the easy axis thereof (e.g., a 45 degree angle in the illustrated embodiment). The AMR element segments 194a, 194b, 194c, 194d may be magnetized so that the easy axis of each of the segments aligns with the longitudinal direction of the sensor (although this might not be the case in some embodiments).

With reference to FIG. 11, the via connections 198 may be formed within groups (e.g., in rows, etc.) that form a 45 degree angle with respect to a longitudinal direction of the sensor 190. If the combined resistance of the barber pole elements 192a, 192b, 192c, 192d, 192e and the corresponding via connections 198 is low enough with respect to the resistance of the AMR element segments 194a, 194b, 194c, 194d, then the current (I) will flow within the AMR element segments 194a, 194b, 194c, 194d at a 45 degree angle, as shown in FIG. 11. For example, in one possible implementation, the resistance of each AMR element segment may be around 20 Ohms, the resistance of each barber pole element may be around 0.1 Ohms, and the resistance of each group of via connections may be around 0.05 Ohms. Thus, the combined resistance of one barber pole element and two via groups will be substantially less than the resistance of one corresponding AMR element segment. In this scenario, the current flow will occur within the AMR element segments at the desired angle. Other resistance scenarios may be used in other embodiments. It should be appreciated that both the number and the size of the via connections used in a particular implementation may be selected so that an appropriate via resistance is achieved to support current flow at the desired angle in the AMR element segments. In some alternative embodiments, the AMR material layer 194 is not cut between the via connection areas.

In the embodiment illustrated in FIGS. 11 and 12, the barber pole elements 192a, 192b, 192c, 192d, 192e are implemented below the AMR element segments 194a, 194b, 194c, 194d. As described previously, this arrangement may provide various benefits related to, for example, the prevention of contamination during the fabrication process. In some embodiments, however, an AMR sensor having a segmented AMR element may be provided with the barber pole elements located above the AMR element segments.

In the embodiment of FIG. 11, the barber pole elements 192a, 192b, 192c, 192d, 192e and the AMR element segments 194a, 194b, 194c, 194d are shown as having edges that also form 45 degree angles to the longitudinal direction of the sensor 190. However, this is not the case in every embodiment. That is, it is the angle associated with the via connections that will establish the current angle within the AMR element segments 194a, 194b, 194c, 194d and not the outer shape of the barber pole elements 192a, 192b, 192c, 192d, 192e and the AMR element segments 194a, 194b, 194c, 194d. The edges of these elements may be angled, however, so that a more compact sensor can be achieved. It should be appreciated that the density of the vias may have to be adjusted in a particular design to achieve a viable resistance scenario in the sensor 190.

In at least one embodiment, an AMR sensor is provided that uses a segmented AMR element, but does not use via connections between the AMR sensor segments and the corresponding barber pole elements. That is, the AMR sensor segments and the barber pole elements are formed in an abutting, conductively coupled relation to one another with no intervening dielectric layer (although there could be one or more intervening conductive layers, such as a seed layer, a diffusion barrier, etc.). For example, with reference to FIG. 12, in one alternative arrangement, the AMR element segments 194a, 194b, 194c, 194d may be disposed directly above the barber pole elements 192a, 192b, 192c, 192d, 192e, with no dielectric layer 196 in between. As described previous, the regions between the barber pole elements 192a, 192b, 192c, 192d, 192e may, in some embodiments, be partially or fully filled with dielectric material before the AMR element segments 194a, 194b, 194c, 194d are formed. Planarization may also be performed before the AMR element segments 194a, 194b, 194c, 194d are formed in some implementations. In the above-described arrangement, the current flow within the AMR element segments 194a, 194b, 194c, 194d will still be at the desired angle with respect to the easy axis. The shapes of the barber pole elements 192a, 192b, 192c, 192d, 192e and the AMR element segments 194a, 194b, 194c, 194d will be more important in this arrangement, however. That is, the edges of these structures will have to be angled to provide the desired current direction.

Figure 13:
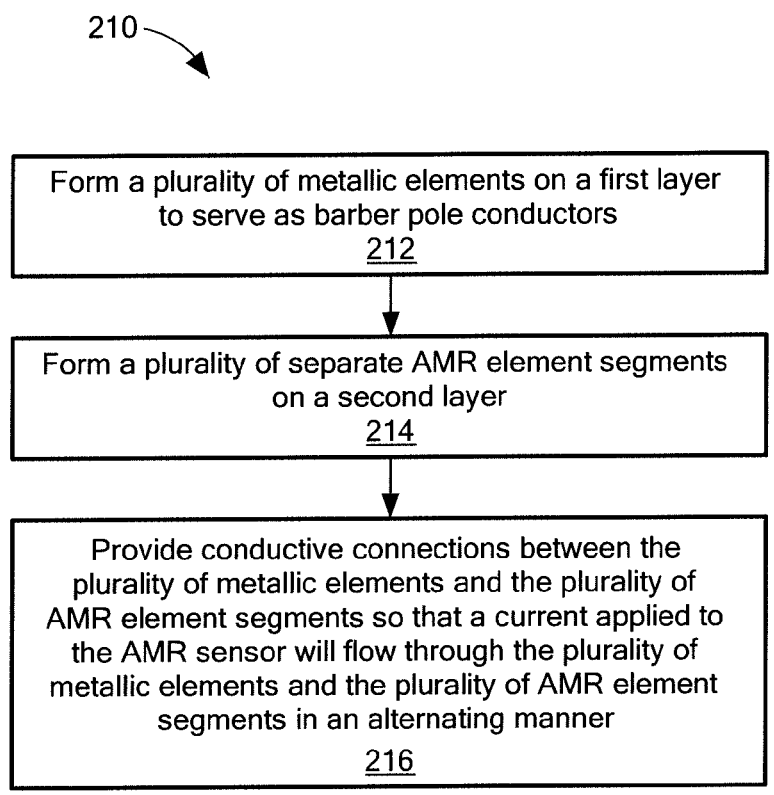
FIG. 13 is a flowchart illustrating a method for fabricating an AMR sensor having a segmented AMR element in accordance with an embodiment.

FIG. 13 is a flowchart illustrating a method 210 for fabricating an AMR sensor having a segmented AMR element in accordance with an embodiment. A plurality of metallic elements are formed on a first layer to serve as barber pole elements for the AMR sensor (block 212). A plurality of separate AMR element segments are provided on a second layer (block 214). Conductive coupling is provided between the plurality of metallic elements and the plurality of AMR element segments so that a current applied to the AMR sensor will flow through the plurality of metallic elements and the plurality of AMR element segments in an alternating fashion during sensor operation. In different embodiments, the metallic elements may be formed either before or after the AMR element segments. In some embodiments, the first layer and the second layer may be separated from one another by at least one dielectric layer. In these embodiments, via connections may be used to provide the conductive coupling between the elements. In other embodiments, the conductive coupling may be provided by forming the plurality of metallic elements and the plurality of AMR element segments in an abutting, conductive relationship to one another.

In some embodiments, the via connections that are used to provide the conductive coupling between the elements are arranged in groups having an orientation that supports current flow at a desired angle within the AMR element segments, during sensor operation. The angle may be, for example, an angle of 45 degrees (or approximately 45 degrees) with respect to an easy angle of the AMR element segments (although other angles may be used in other implementations). The via connections will typically be formed after the formation of the plurality of metallic elements and the formation of the plurality of AMR element segments. In one implementation, for example, the plurality of metallic elements may first be formed on an ILD layer. One or more other dielectric layers may then be deposited over the plurality of metallic elements. The AMR element segments may then be formed over the intervening dielectric layer(s). The via connections may then be formed to conductively couple the metallic elements to the AMR element segments. Techniques for forming via connections in desired locations are well known in the art. In at least one implementation, after the metallic elements have been conductively coupled to the AMR element segments, a passivation layer may be applied over the AMR sensor to protect the sensor from external environmental conditions.

In the discussion above, various exemplary embodiments have been described. It will be apparent to those of ordinary skill in the art that modifications and variations may be made to these exemplary embodiments without departing from the spirit and scope of the invention. These modifications and variations are considered to be within the purview and scope of the invention and the appended claims. It will also be apparent to those of ordinary skill in the art that the disclosed embodiments, although different, are not necessarily mutually exclusive. That is, one or more features, structures, or characteristics described herein in connection with one embodiment may be incorporated into one or more other embodiments to form new embodiments without departing from the spirit and scope of the invention. Similarly, the location or arrangement of individual elements within each disclosed embodiment may be modified without departing from the spirit and scope of the invention. All publications and references cited herein are expressly incorporated herein by reference in their entirety.

What is claimed is:

1. An anisotropic magneto-resistive (AMR) sensor comprising:
   an inter layer dielectric (ILD) surface;
   a seed layer formed over the ILD surface;
   an AMR element formed on the seed layer, the AMR element being at least partially formed from an AMR material; and
   barber poles formed over the AMR element, the barber poles each including a lower portion formed of metal and an upper portion formed of a capping material that is different from the metal of the lower portion, the capping material of the upper portion of the barber poles to protect other materials in the AMR sensor from exposure to the metal of the lower portion of the barber poles.

2. The AMR sensor of claim 1, wherein:
   the capping material of the upper portion of the barber poles includes tantalum.

3. The AMR sensor of claim 2, wherein:
   the capping material of the upper portion of the barber poles is a first capping material; and
   the AMR element includes a lower portion formed of an AMR material and an upper portion formed of a second capping material, the upper portion of the AMR element to protect other materials in the AMR sensor from exposure to the AMR material in the lower portion of the AMR element.

4. The AMR sensor of claim 3, wherein:
   the second capping material of the AMR element has a higher resistivity than the AMR material of the AMR element.

5. The AMR sensor of claim 3, wherein:
   the AMR material includes nickel-iron (NiFe) and the second capping material includes at least one of: tantalum, ruthenium, titanium, aluminum, and alloys containing one or more of the above.

6. The AMR sensor of claim 1, further comprising:
   a passivation layer covering the barber poles and the AMR element.

7. The AMR sensor of claim 6, wherein:
   the passivation layer contacts the AMR material of the AMR element through regions between the barber poles.

8. The AMR sensor of claim 6, wherein:
   the capping material of the upper portion of the barber poles is a first capping material;
   the AMR element includes a lower portion formed of an AMR material and an upper portion formed of a second capping material; and
   the passivation layer contacts the second capping material of the upper portion of the AMR element through regions between the barber poles.

9. A method of fabricating an anisotropic magneto-resistive (AMR) sensor, comprising:
   providing an inter layer dielectric (ILD) surface;
   depositing a seed layer over the ILD surface;
   forming a layer of AMR material on the seed layer;
   forming a metal layer over the layer of AMR material;
   forming a capping layer over the metal layer;
   performing first patterning after forming the capping layer, the first patterning to form an AMR element from the layer of AMR material; and
   performing second patterning after performing the first patterning, the second patterning to form barber poles from the metal layer and the capping layer.

10. The method of claim 9, wherein:
the capping layer is to reduce exposure of other materials in the AMR sensor to the metal of the metal layer.

11. The method of claim 9, wherein:
performing first patterning includes stopping the first patterning within a dielectric material.

12. The method of claim 9, wherein:
performing second patterning includes stopping the second patterning at the AMR material of the AMR element.

13. The method of claim 9, wherein:
the capping layer is a first capping layer; and
the method further comprises forming a second capping layer over the layer of AMR material before forming the metal layer.

14. The method of claim 13, wherein:
performing second patterning includes stopping the second patterning at or within the second capping layer.

15. The method of claim 13, wherein:
the first capping layer and the second capping layer each include tantalum.

16. The method of claim 9, wherein:
performing first patterning and performing second patterning both include using ion beam etching.

17. The method of claim 9, wherein:
performing first patterning and performing second patterning use different etching techniques.

* * * * *

UNITED STATES PATENT AND TRADEMARK OFFICE
CERTIFICATE OF CORRECTION

PATENT NO. : 8,848,320 B1
APPLICATION NO. : 14/043057
DATED : September 30, 2014
INVENTOR(S) : Paul A. David et al.

It is certified that error appears in the above-identified patent and that said Letters Patent is hereby corrected as shown below:

In the Specification

Column 1, line 39 delete "with a still another" and replace with --with an--.

Column 2, line 14 delete "with a yet" and replace with --with yet--.

Column 3, line 46 delete ". Because of the" and replace with --. Because the--.

Column 5, lines 5-6 delete "of variety" and replace with --of a variety--.

Column 5, line 10 delete "above described" and replace with --above-described--.

Column 5, line 37 delete "may within" and replace with --may be within--.

Column 5, line 59 delete "of variety" and replace with --of a variety--.

Column 10, line 23 delete "compete" and replace with --complete--.

Signed and Sealed this
First Day of December, 2015

Michelle K. Lee
*Director of the United States Patent and Trademark Office*